(12) United States Patent
Inoue

(10) Patent No.: US 6,232,224 B1
(45) Date of Patent: May 15, 2001

(54) METHOD OF MANUFACTURING SEMICONDUCTOR DEVICE HAVING RELIABLE CONTACT STRUCTURE

(75) Inventor: Ken Inoue, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/549,714

(22) Filed: Apr. 14, 2000

(30) Foreign Application Priority Data

Apr. 20, 1999 (JP) .................................................. 11-111726

(51) Int. Cl.[7] ....................................................... H01L 21/28
(52) U.S. Cl. .............................................. 438/639; 438/672
(58) Field of Search ....................................... 438/639, 672, 438/702, 906, 976, FOR 196

(56) References Cited

U.S. PATENT DOCUMENTS

| | | |
|---|---|---|
| 5,545,590 * | 8/1996 | Licata . |
| 5,899,720 * | 5/1999 | Mikagi . |
| 6,004,874 * | 12/1999 | Cleeves . |
| 6,012,469 * | 1/2000 | Li et al. . |
| 6,027,966 * | 2/2000 | Saenger et al. . |
| 6,037,261 * | 3/2000 | Jost et al. . |
| 6,040,242 * | 3/2000 | Kakehashi . |
| 6,040,243 * | 3/2000 | Li et al. . |
| 6,083,828 * | 7/2000 | Lin et al. . |

FOREIGN PATENT DOCUMENTS 11-145283  5/1999  (JP) .

* cited by examiner

Primary Examiner—George Fourson
Assistant Examiner—Joannie A. Garcia
(74) Attorney, Agent, or Firm—Young & Thompson

(57) ABSTRACT

A method of manufacturing a semiconductor device having a reliable contact structure. In this method, a semiconductor element such as a MOS transistor is formed on a semiconductor substrate. A first insulating film is formed on the semiconductor substrate so as to cover the semiconductor element and the first insulating film is selectively removed to form an opening. A stopper film is formed on at least a portion of an inner side surface of the opening. A contact surface of the semiconductor element exposed at a bottom portion of the opening is cleaned by wet etching which uses dilute hydrofluoric acid. The stopper film is made of material which is hard to be etched by dilute hydrofluoric acid. Then, the opening is filled with conductive material. In the cleaning process, the inner side surface of the contact hole is not etched and an inner diameter or a cross sectional area of the contact hole is not enlarged.

20 Claims, 7 Drawing Sheets

PRIOR ART

US 6,232,224 B1

METHOD OF MANUFACTURING SEMICONDUCTOR DEVICE HAVING RELIABLE CONTACT STRUCTURE

FIELD OF THE INVENTION

The present invention relates generally to a method of manufacturing a semiconductor device having a reliable contact structure for electrically coupling a circuit element on a semiconductor substrate with a wiring layer and the like. More particularly, the present invention relates to a method of manufacturing a semiconductor device in which a reliable electrical contact is formed by using a contact hole opened or formed in an interlayer insulating film.

BACKGROUND OF THE INVENTION

In order to form electrical connections to a semiconductor element such as a MOS transistor and the like formed on a semiconductor substrate, there is known a method in which, at regions corresponding to source/drain regions of the MOS transistor, contact holes or openings are formed through an interlayer insulating film covering the MOS transistor, and the contact holes or opening are filled with conductive material to form contact plugs. Thereby, the source/drain regions are electrically coupled with upper layer wiring conductors or other electric circuit elements formed on the interlayer insulating film via the contact plugs. However, according to a recent increase in an integration degree of a semiconductor device, a gate electrode and source/drain regions of a MOS transistor become minute. Therefore, it is required that contact holes are precisely formed in an interlayer insulating film. That is, if a position of a contact hole is not correctly aligned with respect to a position of a MOS transistor, when a contact hole is formed, for example, on a source/drain region, there is a possibility that, for example, a part of a gate electrode is exposed within the contact hole. In such case, when the contact hole is filled with a conductive material, the conductive material short-circuits the gate electrode and the source/drain electrode, so that a defective element is produced. Otherwise, when the contact hole is formed, a part of an element isolation oxide film is etched, and the conductive material filling the contact hole penetrates into the etched part of the element isolation oxide film, so that there is a possibility that adjacent source/drain regions are short-circuited. Especially, if each of the contact holes on the source/drain regions is not opened enough, an electrical connection to each of the source/drain regions may become incomplete. Thus, when a contact hole is formed, an interlayer insulating film is usually slightly over-etched to open the contact hole well. Therefore, if a location of the contact hole is not aligned correctly with respect to a location of a MOS transistor, a silicon oxide film on the side portion of a gate electrode or the element isolation oxide film is etched away by the over-etching, thereby the above-mentioned defective element is produced.

Conventionally, in order to avoid such disadvantage, a technology is proposed in which a silicon nitride film having etching selectivity with respect to a silicon oxide film constituting an interlayer insulating film, that is, having an etching rate different from that of a silicon oxide film, is used. Thereby, occurrence of a defective element due to the shift of location of a contact hole is avoided. FIG. 8A through FIG. 8C show schematic cross sectional structures obtained during a process according to such technology. As shown in FIG. 8A, an SIT (Shallow Trench Isolation) 202 made of silicon oxide is formed on a silicon substrate 201, for example, a p-type silicon substrate, to define an element forming region. Then, by using a commonly used method, a gate insulating film 204 and a gate electrode 205 are formed in the element forming region. By using the gate electrode 205 as a mask, impurities are implanted into the silicon substrate 201 at a low impurity concentration and LDD regions 206 of, for example, n type are formed. Also, sidewall spacers 207 made of silicon oxide are formed on both side surfaces of the gate electrode 205. Thereafter, by using the gate electrode 205 and the sidewall spacers 207 as a mask, impurities are implanted into the silicon substrate 201 at a high concentration to form source/drain regions 208 of, for example, $n^+$ type. In this way, a MOS transistor is formed. Then, a silicon nitride film 210 is formed on whole surface of the substrate 201 such that the MOS transistor is wholly covered thereby, and further a silicon oxide film, for example, BPSG film (boro-phospho silicate glass film) or BSG film (boro-silicate glass film), is formed on the silicon nitride film 210 as an interlayer insulating film 211 which covers the MOS transistor. Thereby, a structure shown in FIG. 8A is obtained.

As shown in FIG. 8B, by using a mask layer 212 such as a photoresist film and the like which is formed by a photolithography and the like, the interlayer insulating film 211 is selectively etched and removed, so that a contact hole 213 is formed in the interlayer insulating film 211. In this case, as shown in FIG. 8B, even if a location of the contact hole 213 is shifted, for example, toward right side with respect to the location of the source/drain region 208, the silicon nitride film 210 functions as an etching stopper film, so that the sidewall spacer 207 and the STI 202 are not etched when the interlayer insulating film 211 is over-etched. For comparison, FIG. 8C shows a cross sectional structure obtained when the contact hole 213 is formed without forming the silicon nitride film 210 in the structure of FIG. 8A. In such case, as shown in FIG. 8C, the sidewall spacer 207 or the STI 202 is etched depending on the direction and magnitude of the shift of location of the contact hole 213.

After the structure of FIG. 8B is obtained, although not shown in the drawing, the silicon nitride film 210 which is exposed at the bottom portion of the contact hole 213 is selectively etched and removed. Thereby, the contact hole 213 reaches the source/drain region 208 and also the sidewall spacer 207 and the STI 202 made of silicon oxide films are hardly etched in the contact hole 213. Therefore, it is possible to prevent the sidewall 207 and STI 202 from being etched when the interlayer insulating film 211 is over-etched, and to avoid production of a defective element.

The above-mentioned conventional technology is effective in case the interlayer insulating film is over-etched when contact holes are opened. However, in a process after forming contact holes reaching source/drain regions, and especially in a pre-treatment step of a process for forming contact plugs by filling conductive material in the contact holes, if an etching process such as cleaning process and the like is performed, the interlayer insulating film and the like is etched by such etching process at the inside surface of the contact hole.

For example, when a technology which is proposed by the applicant of this application and which is disclosed in Japanese patent application No. 9-305387 (Japanese patent laid-open publication No. 11-145283) is applied to a manufacturing of the semiconductor device shown in FIG. 8A and 8B, a manufacturing process becomes as follows. That is, as shown in FIG. 9A, a metal silicide layer 209 such as tungsten silicide and the like is formed on the upper surface of a gate electrode of a MOS transistor and on the surface of the source/drain regions 208 of a silicon substrate 201. Then, by using two time etching processes, a contact hole 213 is formed in an interlayer insulating film 211 and a silicon nitride film 210. The contact hole 213 is filled with a conductive material such as polysilicon and the like, and thereby a contact plug 215 coupling with the metal silicide layer 209 is formed. In this case, there is a possibility that, because of the surface roughness of the metal silicide layer 209, a contact resistance between the contact plug 215 and the metal silicide layer 209 becomes large. In order to avoid such disadvantage, in practice, as shown in FIG. 9B, the surface of the metal silicide layer 209 exposed at the bottom surface of the contact hole 213 is cleaned by wet etching which uses dilute hydrofluoric acid and the like, after forming the contact hole 213 in the interlayer insulating film 211 and the silicon nitride film 210. By this cleaning, the surface of the metal silicide layer 209 is slightly etched and the roughness of the surface thereof is removed. Thus, the contact resistance between the contact plug 215 formed thereafter and the metal silicide layer 209 can be reduced.

However, when the cleaning of the surface of the metal silicide layer 209, in other words, the contact surface of an element, is performed by using dilute hydrofluoric acid as shown in FIG. 9B, the interlayer insulating film 211 composed of a silicon oxide film is also etched at the same time. Especially, since the inner surface of the contact hole 213 is exposed extensively to the dilute hydrofluoric acid, etching progresses remarkably at the inner surface of the contact hole 213. Also, BPSG, BSG or the like constituting the interlayer insulating film 211 is easily etched by the dilute hydrofluoric acid. Therefore, as shown by a chain line in FIG. 9B, an inner diameter of the contact hole 213 is enlarged. As the inner diameter of the contact hole 213 is enlarged, there is a possibility that the contact hole 213 overlaps any other contact hole or contact holes adjacent to the contact hole 213, for example, a contact hole formed for another adjacent MOS transistor and not shown in the drawing. That is, there is a possibility that contact holes disposed mutually in close proximity overlap with each other and that, when the contact holes are filled with conductive material to form contact plugs, the contact plugs short-circuit with each other. Thereby, a manufacturing yield of semiconductor devices deteriorates.

Also, in case the interlayer insulating film 211 has a stacked structure which comprises a plurality of insulating films of, for example, a plasma silicon oxide film and a BSG film, since the BSG film is etched faster than the plasma silicon oxide film by dilute hydrofluoric acid, an inner side surface of the contact hole 213 is etched non-uniformly by a cleaning process of a contact surface of a circuit element exposed at the bottom surface of the contact hole, so that the inner side surface of the contact hole 213 becomes uneven. Therefore, when the contact hole 213 is filled with conductive material to form a contact plug, there is a possibility that the contact plug has void or voids and it becomes difficult to fabricate a reliable contact plug 215 having low electrical resistance. In order to avoid such disadvantage, strict control of fabrication process steps for the contact structure is required which leads to an increase in manufacturing cost and deterioration of manufacturing yield.

SUMMARY OF THE INVENTION

Therefore, it is an object of the present invention to provide a method of manufacturing a semiconductor device by which a reliable contact structure can be fabricated.

It is another object of the present invention to provide a method of manufacturing a semiconductor device by which a reliable contact structure having low electrical resistance can be fabricated.

It is still another object of the present invention to provide a method of manufacturing a semiconductor device by which a reliable contact structure can be easily fabricated.

It is still another object of the present invention to provide a method of manufacturing a semiconductor device by which a reliable contact structure can be fabricated with high manufacturing yield.

It is still another object of the present invention to provide a method of manufacturing a semiconductor device in which an inner side surface of a contact hole is not substantially etched even when a contact surface of a circuit element is cleaned at the bottom surface of the contact hole.

It is still another object of the present invention to provide a method of manufacturing a semiconductor device in which an inner diameter or a cross sectional area of a contact hole is not substantially enlarged even when a contact surface of a circuit element is cleaned at the bottom surface of the contact hole.

It is still another object of the present invention to provide a method of manufacturing a semiconductor device in which an inner side surface of a contact hole is not unevenly etched even when a contact surface of a circuit element is cleaned at the bottom surface of the contact hole.

It is still another object of the present invention to obviate the disadvantages of the conventional method of manufacturing a semiconductor device having a contact hole.

According to an aspect of the present invention, there is provided a method of manufacturing a semiconductor device comprising: preparing a semiconductor substrate; forming a semiconductor element on the semiconductor substrate; forming a first insulating film on the semiconductor substrate so as to cover the semiconductor element; selectively removing the first insulating film to form an opening; forming a stopper film on at least a portion of an inner side surface of the opening; cleaning a contact surface of the semiconductor element exposed at a bottom portion of the opening, the stopper film being made of material which is resistant against a cleaning fluid used in the cleaning process; and filling the opening with conductive material.

In this case, it is preferable that, in the cleaning a contact surface of the semiconductor element exposed at a bottom portion of the opening, wet etching is performed by using dilute hydrofluoric acid.

It is also preferable that the stopper film is made of material which is hard to be etched by dilute hydrofluoric acid.

It is further preferable that the stopper film is made of electrically conductive material.

It is advantageous that the stopper film and the conductive material filled into the opening in the filling the opening with conductive material constitutes a contact plug.

It is also advantageous that the stopper film comprises at least one material selected from a group consisting of polysilicon and amorphous silicon.

It is further advantageous that, on the contact surface of the semiconductor element, there is formed a refractory metal silicide layer; and wherein in the cleaning a contact surface of the semiconductor element exposed at a bottom portion of the opening, at least a portion of the refractory metal silicide layer exposed at a bottom portion of the opening is removed by etching.

It is preferable that the first insulating film includes silicon oxide.

It is also preferable that the first insulating film includes at least one material selected from a group consisting of BSG (boro-silicate glass) and BPSG (boro-phospho silicate glass).

It is further preferable that the first insulating film has a stacked structure comprising a plurality of insulating films.

It is advantageous that the semiconductor substrate is a silicon substrate.

It is also advantageous that the semiconductor element is a MOS transistor.

It is further advantageous that the opening is a contact hole.

It is preferable that, in the filling the opening with conductive material, the opening is filled with polysilicon.

It is also preferable that the forming a stopper film on at least a portion of an inner side surface of the opening comprises: forming a stopper film on whole surface of the semiconductor substrate; and etching back the stopper film to remove the stopper film from portions other than the side surface of the opening and to leave the stopper film on the side surface of the opening.

It is advantageous that the method of manufacturing a semiconductor device further comprises, after the forming a semiconductor element on the semiconductor substrate and before the forming a first insulating film on the semiconductor substrate so as to cover the semiconductor element, forming a second insulating film on the semiconductor substrate so as to cover the semiconductor element, the second insulating film functions as an etching stopper film in the selectively removing the first insulating film to form an opening; wherein, in the forming a first insulating film on the semiconductor substrate so as to cover the semiconductor element, the first insulating film is formed on the second insulating film; and wherein, in the selectively removing the first insulating film to form an opening, the second insulating film is exposed at a bottom portion of the opening.

It is also advantageous that the method of manufacturing a semiconductor device further comprises, after the forming a stopper film on at least a portion of an inner side surface of the opening and before the cleaning a contact surface of the semiconductor element exposed at a bottom portion of the opening, removing a portion of the second insulating film which is exposed at a bottom portion of the opening formed in the first insulating film, thereby making the opening reach the contact surface of the semiconductor element.

It is further advantageous that the second insulating film is a silicon nitride film.

According to another aspect of the present invention, there is provided a method of manufacturing a semiconductor device comprising: preparing a silicon substrate; forming at least a gate electrode and source/drain regions on the silicon substrate to form a MOS transistor; forming a refractory metal silicide layer on at least the source/drain regions; forming a silicon nitride film on the silicon substrate so as to cover the MOS transistor; forming an insulating film including at least silicon oxide on the silicon nitride film; selectively removing the insulating film to form an opening; forming a stopper film on whole surface of the silicon substrate, the stopper film comprises first conductive material which is hard to be etched by dilute hydrofluoric acid; anisotropically etching the stopper film to remove the stopper film from portions other than the side surface of the opening and to leave the stopper film on the side surface of the opening; removing a portion of the silicon nitride film which expose at a bottom portion of the opening, thereby making the opening reach the refractory metal silicide layer; cleaning a surface portion of the refractory metal silicide layer which is exposed at a bottom portion of the opening by wet etching which uses dilute hydrofluoric acid; and filling the opening with second conductive material, the second conductive material filling the opening together with the first conductive material constituting the stopper film form a contact plug.

In this case, it is preferable that the method of manufacturing a semiconductor device further comprises, after the preparing a silicon substrate and before the forming at least a gate electrode and source/drain regions on the silicon substrate to form a MOS transistor, forming an element isolation insulating film for defining an element forming region on the silicon substrate, and wherein, in the forming at least a gate electrode and source/drain regions on the silicon substrate to form a MOS transistor, the MOS transistor is formed in the element forming region defined by the element isolation insulating film, and sidewall spacers are formed on sidewalls of the gate electrode.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, embodiments of the present invention will now be described in detail.

FIGS. 1A through 1C, FIGS. 2A and 2B, FIGS. 3A and 3B, and FIG. 4 show schematic cross sectional structures of workpieces obtained during a process of manufacturing a semiconductor device according to a first embodiment of the present invention. In this embodiment, a memory cell of a DRAM device is manufactured as an example and the memory cell comprises a MOS transistor and a capacitor.

Figure 1A:
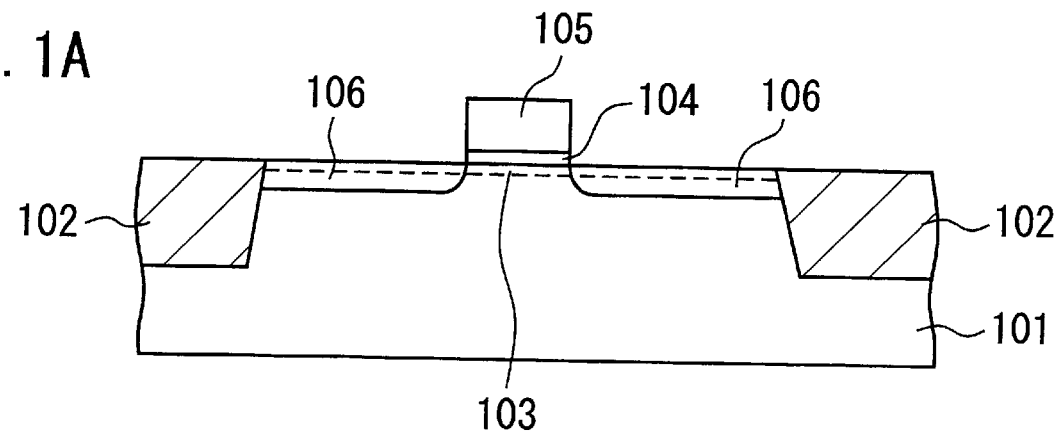
FIG. 1A through FIG. 1C are cross sectional views showing schematic cross sectional structures of workpieces obtained during a process of manufacturing a semiconductor device according to a first embodiment of the present invention.

First, as shown in FIG. 1A, STI's (shallow trench isolations) 102 are formed on a silicon substrate 101 of, for example, p type, as an element isolation oxide film. The STI's 102 are formed as follows. That is, element isolation regions of the silicon substrate 101 are shallowly etched by using a resist layer not shown in the drawing and formed on the surface of the silicon substrate 101 by using a photolithography and the like as a mask, thereby shallow trenches are formed. A silicon oxide film is grown in the shallow trenches, and the surface of the silicon substrate 101 is polished by a CMP method and the like to planarize the surface thereof. Thereby, the STI's 102 are formed on the silicon substrate 101.

Then, after exposing an element forming region at the surface of the silicon substrate 101, in order to control or adjust a threshold voltage of a MOS transistor formed thereafter, boron is ion implanted into a portion in the proximity of the surface of the silicon substrate 101 to form an impurity region 103. Also, a native oxide film not shown in the drawing and formed on the surface of the silicon substrate 101 is removed by a cleaning process which uses acid such as dilute hydrofluoric acid and the like. Thereafter, a gate oxide film 104 is formed. Further, a polysilicon film is formed on whole surface of the silicon substrate 101 by using a CVD method. Then, by using a resist film not shown in the drawing and patterned by photolithography and the like as a mask, the polysilicon film is selectively etched and removed by dry etching technology which uses a gas such as HBr, Cl or the like, thereby a gate electrode 105 is formed. Also, by using the gate electrode 105 as a mask, phosphorus is ion implanted at a low concentration into the silicon substrate 101, thereby LDD regions 106 of, for example, n⁻ type are formed. In this case, phosphorus is also implanted into the gate electrode 105. In this way, a structure shown in FIG. 1A is obtained.

Figure 1B:
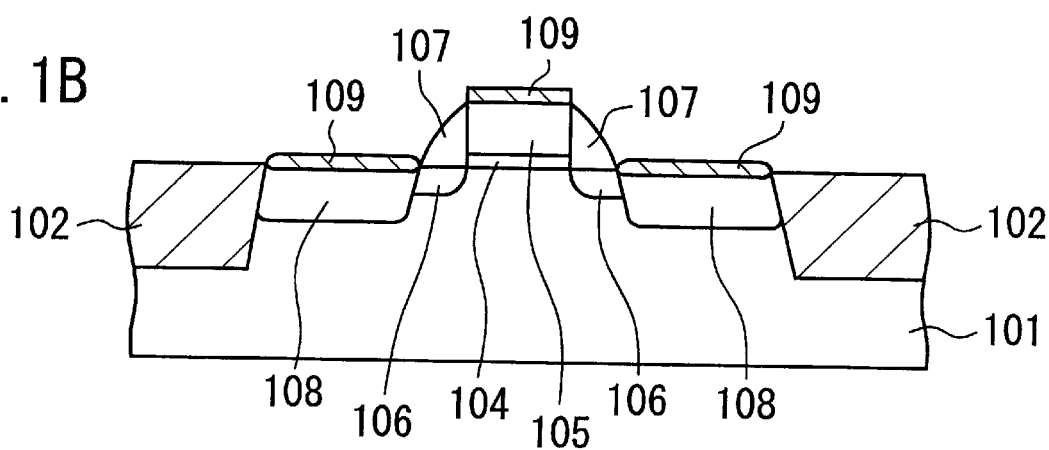

As shown in FIG. 1B, a silicon oxide film is then formed on the whole surface of the silicon substrate 101, and the silicon oxide film is etched back by using anisotropic dry etching. Thereby, sidewall spacers 107 are formed on the side surface portions of the gate electrode 105. Then, by using the gate electrode 105 and the sidewall spacers 107 as a mask, arsenic is ion implanted into the silicon substrate 101 and source/drain regions 108 of, for example, n⁺ type are formed. In this process, arsenic is also doped into the gate electrode 105. Thereafter, heat treatment is performed for activation. Thereby, a MOS transistor is fabricated.

Further, a cobalt film having a thickness of approximately 15 nm is deposited on whole surface of the silicon substrate 101 including on the gate electrode 105 and on the sidewall spacers 107. Then, an RTA (Rapid Thermal Annealing) process is performed at a temperature approximately between 500 and 600 degrees Celsius. By this RTA process, silicide formation reaction occurs at portions of the silicon substrate 101 and the gate electrode 105 where silicon and cobalt contacts. Thereafter, unreacted cobalt film portions existing on oxide film portions of the STI's 102, the sidewall spacers 107 and the like are removed, for example, by wet etching process which uses a mixed solution of hydrochloric acid and hydrogen peroxide. Then, an RTA process is performed at a temperature approximately between 750 and 800 degrees Celsius and thereby a cobalt silicide layer 109 is formed. That is, the cobalt silicide layer 109 is formed on the upper surface of the gate electrode 105 and on the surfaces of the source/drain regions 108 to a thickness of approximately 40 through 50 nm.

Figure 1C:
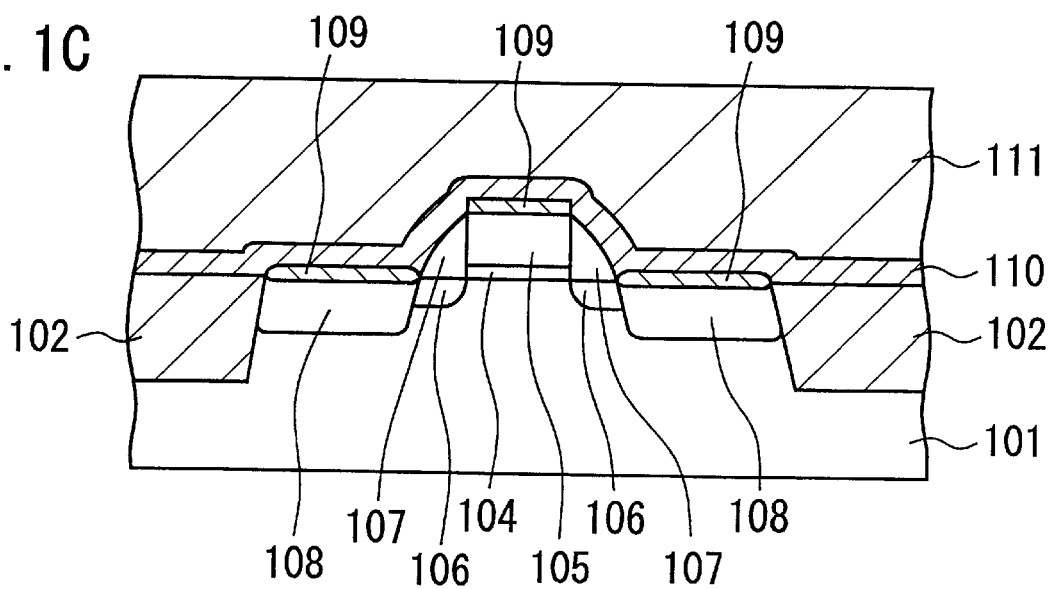

Next, as shown in FIG. 1C, a silicon nitride film 110 is formed on the whole surface of the silicon substrate 101, and an interlayer insulating film 111 is formed on the silicon nitride film 110 by depositing a silicon oxide film such as a BPSG (boro-phospho silicate glass) film, a BSG (boro-silicate glass) film or the like thereon.

Figure 2A:
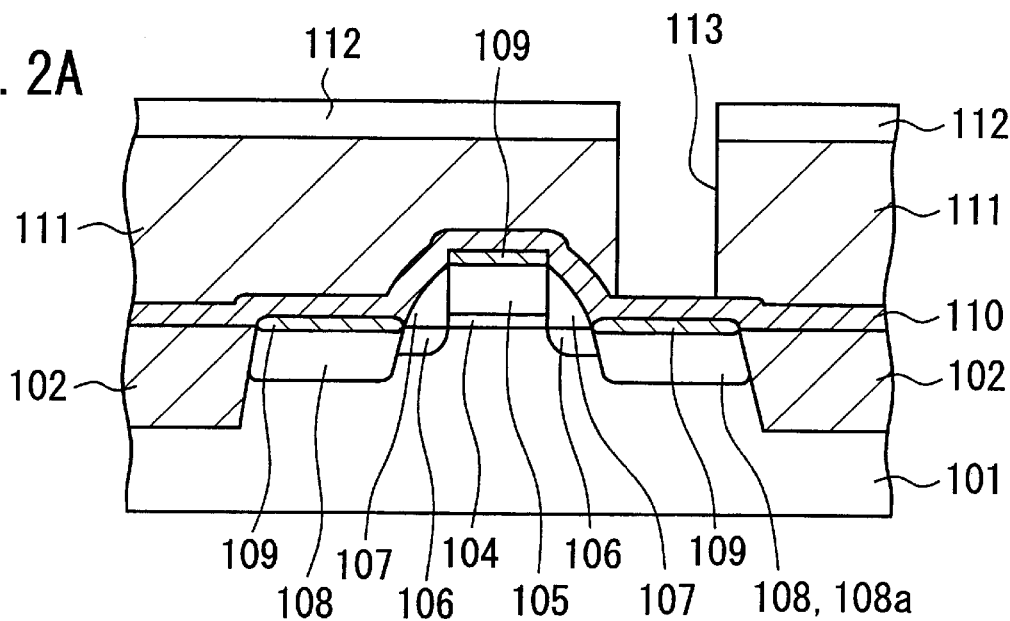
FIG. 2A and FIG. 2B are cross sectional views showing schematic cross sectional structures of workpieces obtained after the structure of FIG. 1C and during a process of manufacturing a semiconductor device according to a first embodiment of the present invention.

As shown in FIG. 2A, by dry etching which uses resist patterns 112 formed by photolithography and the like as a mask, an opening or contact hole 113 is formed at a predetermined portion of the interlayer insulating film 111, that is, a portion corresponding to a drain region 108a which is one of the source/drain regions 108 of the MOS transistor in this embodiment. In this case, an etching method is used in which an etching rate of silicon oxide film is larger than that of silicon nitride. In this process of forming the contact hole 113, the interlayer insulating film 111 is over-etched with respect to the thickness of the interlayer insulating film 111 such that all contact holes for MOS transistors which need the contact holes are surely opened to reach the silicon nitride film 110, regardless of variation of the film thickness of the interlayer insulating film 111. In this case, because of an etching selectivity between the silicon oxide film and the silicon nitride film, that is, because of a difference of etching rates therebetween, the silicon nitride film 110 is not removed by etching. That is, the silicon nitride film 110 functions as an etching stopper film. Therefore, even if a location of the contact hole 113 is shifted, the silicon oxide film which constitutes the sidewall spacers 107 and the STI's 102 existing under the silicon nitride film 110 is not etched.

Figure 2B:
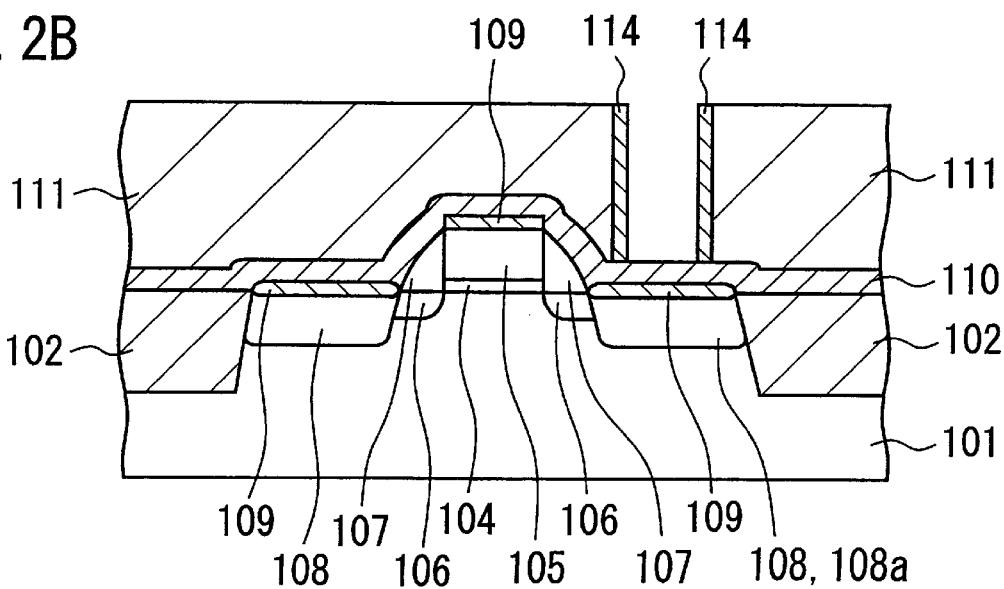

Subsequently, as shown in FIG. 2B, on whole surface of the silicon substrate 101, a DOPOS (Doped Polysilicon) film 114 which is a polysilicon film doped with impurities to lower resistance thereof is grown to a predetermined thickness. The thickness of the DOPOS film 114 is determined such that the DOPOS film 114 is deposited at least on an inner side surface of the contact hole 113 and the inner side surface of the contact hole 113 is covered by the DOPOS film 114. Thereafter, anisotropic dry etching is performed on the DOPOS film 114, and portions of the DOPOS film 114 on the top surface of the interlayer insulating film 111 and on the inner bottom surface of the contact hole 113 are removed. Thereby, as shown in FIG. 2B, the DOPOS film 114 remains only on the substantially vertical inner side surface of the contact hole 113, that is, on the side surface of the interlayer insulating film 111, as a stopper film.

Figure 3A:
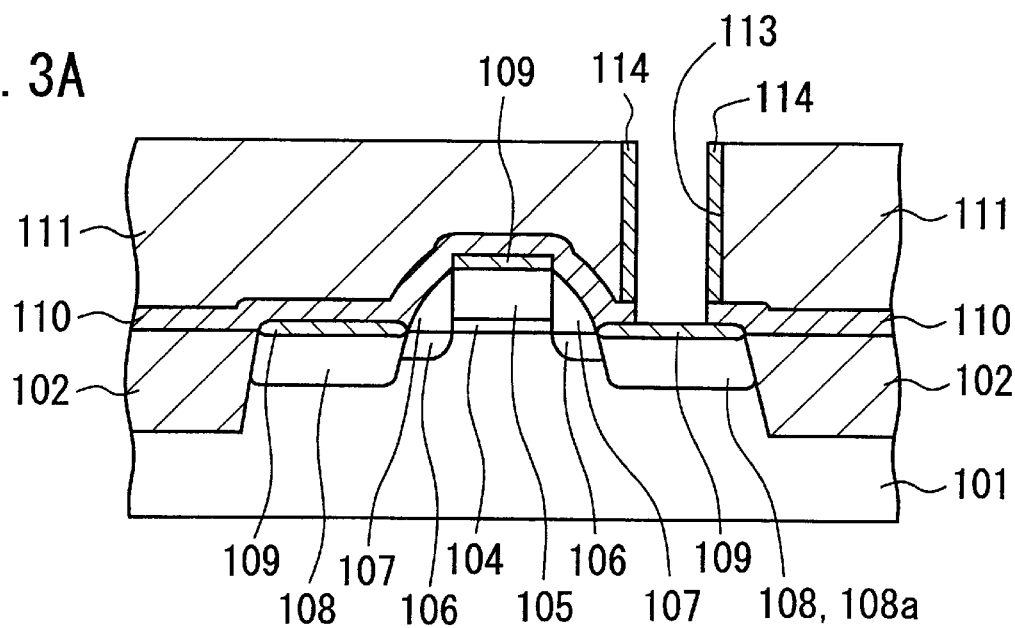
FIG. 3A and FIG. 3B are cross sectional views showing schematic cross sectional structures of workpieces obtained after the structure of FIG. 2B and during a process of manufacturing a semiconductor device according to a first embodiment of the present invention.

As shown in FIG. 3A, a portion of the silicon nitride film 110 exposed at the inner bottom surface of the contact hole 113 is removed by dry etching, and a portion of the cobalt silicide layer 109 is exposed. Thereby, the contact hole 113 reaches the cobalt silicide layer 109 on the drain region 108a. By previously forming the silicon nitride film 110 relatively thinly, it is possible to decrease degree of overetching of the silicon nitride film 110. Therefore, even if location of a contact hole 113 is shifted from a correct location, the sidewall spacer 107 or the STI 102 are hardly etched. Also, in the etching process of the silicon nitride film 110, it is preferable to use an etching method in which an etching rate of the silicon nitride film is larger than that of the silicon oxide film.

Also, in order to remove roughness of the surface of the cobalt silicide layer 109 exposed at the inner bottom surface of the contact hole 113, an RTA process is performed at a temperature of approximately 800 degrees Celsius for approximately 10 seconds, and a cleaning process comprising wet etching which uses dilute hydrofluoric acid and the like is performed, so that the surface of the cobalt silicide layer 109 exposed at the inner bottom surface of the contact hole 113 is slightly etched. Thereby, at the inner bottom surface of the contact hole 113, the surface of the cobalt silicide layer 109 which is cleaned and smoothed is exposed. In this case, since the inner side surface of the contact hole 113, that is, the side surface of the interlayer insulating film 111, is covered with the DOPOS film 114 which is hard to be etched by dilute hydrofluoric acid. Further, the silicon nitride film 110 is also hard to be etched by dilute hydrofluoric acid. Thus, the inner side surface of the contact hole 113 is not etched in the cleaning process by dilute hydrofluoric acid. Therefore, an inner diameter of the contact hole 113 is not enlarged by the cleaning process.

Figure 3B:
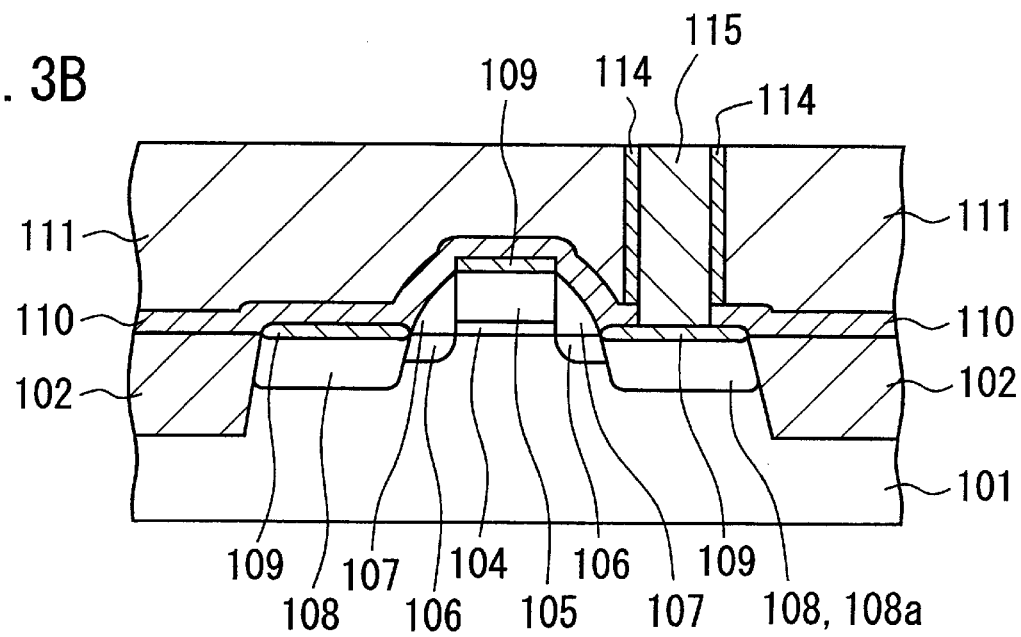

Then, as shown in FIG. 3B, a phosphorus doped polysilicon film is deposited on whole surface of the silicon substrate 101 such that the contact hole 113 is filled with the phosphorus doped polysilicon, and a polishing process by a CMP method and the like is performed. Thereby, a contact plug 115 is formed which comprises the phosphorus doped polysilicon film buried in the contact hole 113.

Figure 4:
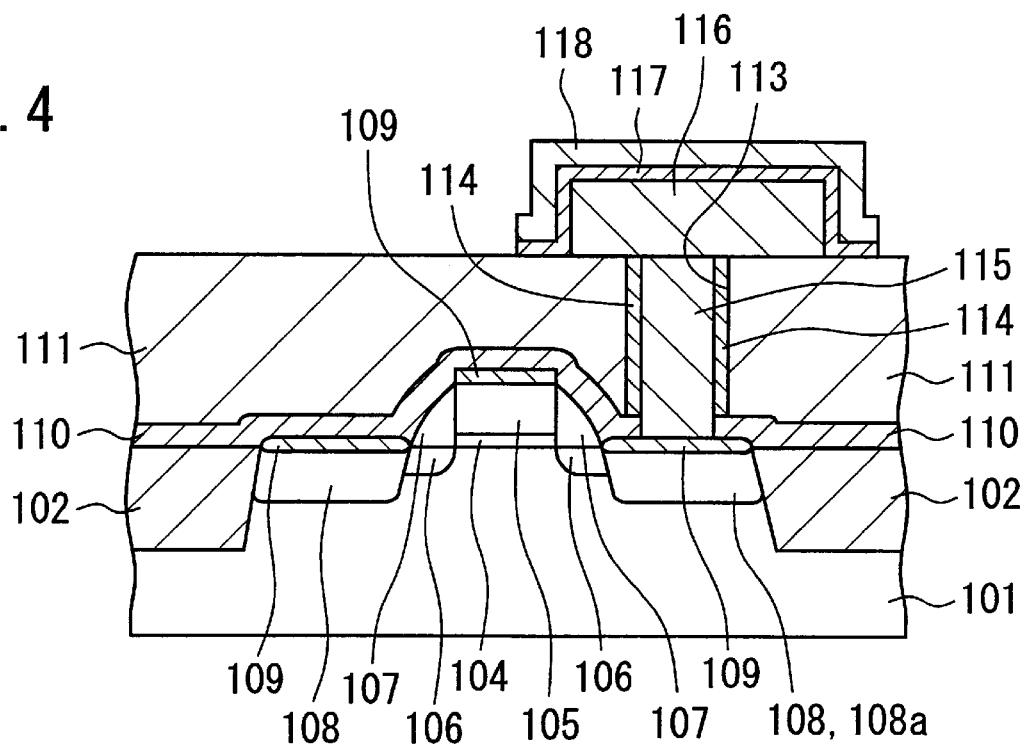
FIG. 4 is a cross sectional view showing a schematic cross sectional structure of workpiece obtained after the structure of FIG. 3B and during a process of manufacturing a semiconductor device according to a first embodiment of the present invention.

Thereafter, as shown in FIG. 4, a phosphorus doped polysilicon film 116 is deposited on whole surface of the silicon substrate 101. The phosphorus doped polysilicon film 116 is removed by, for example, photolithography and etching, and the like, except for a necessary region, that is, a capacitor electrode region above the contact plug 115 which is coupled with the drain region 108a of the MOS transistor. Thereby, a capacitor electrode 116 of a memory cell of a DRAM device is formed which comprises the remained portion of the phosphorus doped polysilicon film 116. Here, the capacitor electrode is also designated by the same reference number as that of the phosphorus doped polysilicon film 116.

Further, an insulating film 117 comprising a silicon oxide film and the like is formed on whole surface of the silicon substrate 101 so as to cover the capacitor electrode 116, and on the insulating film 117, a conductor film 118 comprising metal or polysilicon is formed. Thereafter, the insulating film 117 and the conductor film 118 are patterned by using photolithography and etching, and the like, and the capacitor insulating film 117 and a common electrode 118 are formed. Here, the capacitor insulating film and the common electrode are designated by the same reference numbers as those of the insulating film 117 and the conductor film 118, respectively. In this way, a memory cell of a DRAM device which is constituted of a MOS transistor and a capacitor is fabricated. In the above, a method of manufacturing of a memory cell of a DRAM device which is constituted of a MOS transistor and a capacitor has been described. However, in practice, it is possible to form a plurality of memory cells, that is, a plurality of MOS transistors and a plurality of capacitors coupled respectively with the MOS transistors, on a silicon substrate.

In the embodiment mentioned above, even if location of the contact hole 113 is shifted from the correct location when the contact hole 113 is formed in the interlayer insulating film 111, it is possible to prevent the sidewall spacer 107 and the STI 102 from being etched unintentionally, because of the existence of the silicon nitride film 110 under the interlayer insulating film 111. It is also possible to prevent the gate electrode 105 and the silicon substrate 101 from exposed in the contact hole 113. Therefore, when the contact plug 115 is formed in a process thereafter to form an electrical connection to the drain region 108, it is possible to avoid short circuit of the contact plug with the gate electrode 105, and to avoid occurrence of a condition in which the contact plug 115 electrically couples directly to the silicon substrate 110 via a region where the STI is etched and the drain region 108 is short-circuited to the substrate 101 or to another source/drain region of an adjacent MOS transistor not shown in the drawing.

Also, in the process of cleaning the surface of the cobalt silicide layer 109 exposed at the inner bottom portion of the contact hole 113 after forming the contact hole 113 which penetrates the interlayer insulating film 111 and the silicon nitride film 110, since the DOPOS film 114 exists on the inner side surface of the contact hole 113 as a stopper film, the inner side surface of the contact hole 113 is not exposed to the cleaning fluid. Therefore, the inner side surface of the contact hole 113 is not etched and an inner diameter or a cross sectional area of the contact hole 113 is not enlarged. Thus, when the cleaning process is performed, the contact hole 113 does not overlap any other contact hole or contact holes adjacent to the contact hole 113, for example, a contact hole formed for another adjacent MOS transistor and not shown in the drawing. Also, when the contact hole 113 is filled with conductive material to form the contact plug 115, the contact plug 115 is not shortcircuited with other contact plugs and the like.

In the embodiment mentioned above, the cobalt silicide layer 109 is formed on the gate electrode 105 and the source/drain regions 108 of the MOS transistor, as an example. However, in place of the cobalt silicide layer 109, it is possible to form other refractory metal silicide layers, such as titanium silicide layer, nickel silicide layer and the like.

Figure 5:
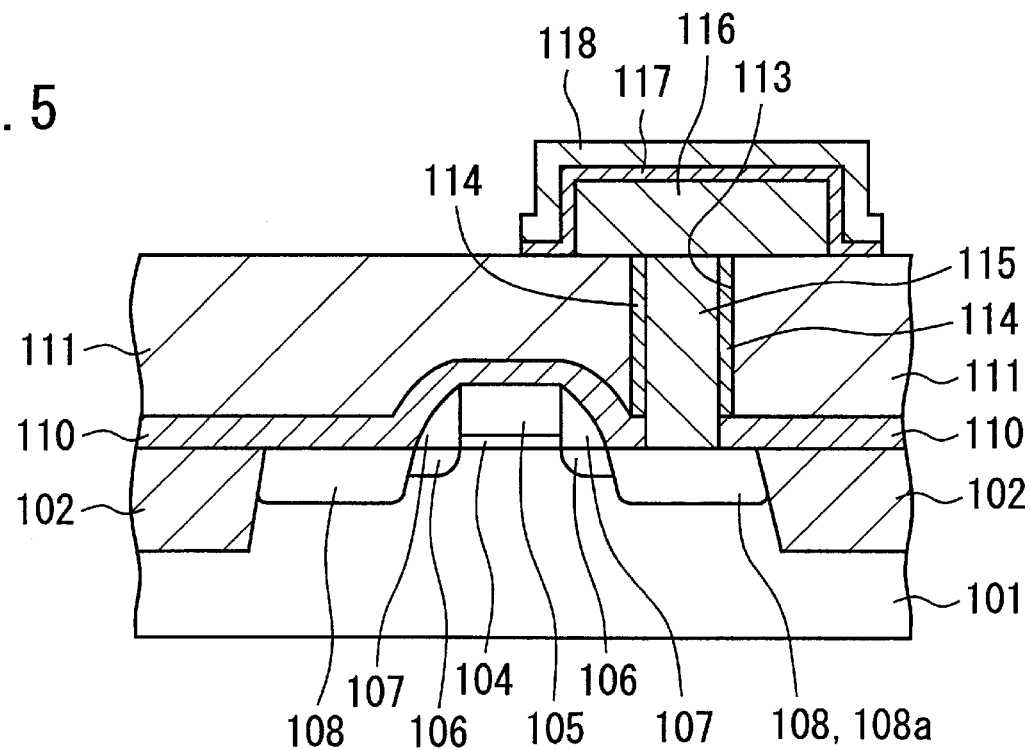
FIG. 5 is a cross sectional view showing a schematic cross sectional structure of workpiece obtained after forming a capacitor insulating film and a common capacitor electrode during a process of manufacturing a semiconductor device according to a second embodiment of the present invention.

FIG. 5 shows a cross sectional structure of a workpiece after forming a capacitor insulating film 117 and a common electrode 118 according to a method of manufacturing a semiconductor device in a second embodiment of the present invention. The cross sectional structure shown in FIG. 5 corresponds to the cross sectional structure shown in FIG. 4 fabricated according to the first embodiment. As shown in FIG. 5, the method according to the second embodiment is substantially the same as that according to the first embodiment, except that, in the second embodiment, a refractory metal silicide layer such as the above-mentioned cobalt silicide layer 109 is not formed. Therefore, detailed explanation thereof is omitted here. In case it is required to perform a cleaning process for cleaning the surface of a silicon substrate 101 exposed at the inner bottom surface of a contact hole 113, here the surface of a drain region 108a to be contacted, there is a possibility that an inner diameter of the contact hole 113 is enlarged by the cleaning process. In order to avoid such enlargement of the inner diameter of the contact hole 113, it is effective to form a DOPOS film 114 on the inner side surface of the contact hole 113 according to this embodiment.

Figure 6:
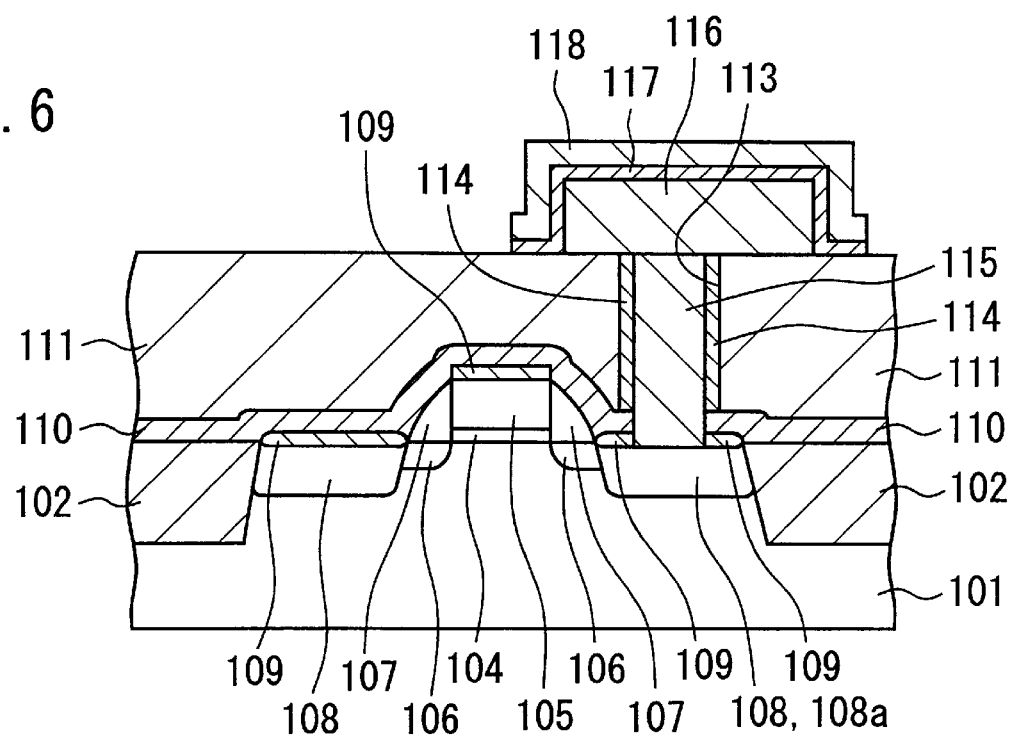
FIG. 6 is a cross sectional view showing a schematic cross sectional structure of workpiece obtained after forming a capacitor insulating film and a common capacitor electrode during a process of manufacturing a semiconductor device according to a third embodiment of the present invention.

FIG. 6 shows a cross sectional structure of a workpiece after forming a capacitor insulating film 117 and a common electrode 118 according to a method of manufacturing a semiconductor device as a third embodiment of the present invention. The cross sectional structure shown in FIG. 6 corresponds to the cross sectional structure shown in FIG. 4 fabricated according to the first embodiment. As shown in FIG. 6, the method according to the third embodiment is substantially the same as that according to the first embodiment, except that, in the third embodiment, a refractory metal silicide layer such as the above-mentioned cobalt silicide layer 109 is etched and removed at an inner bottom surface of a contact hole 113 throughout a whole thickness of the refractory metal silicide layer. Therefore, detailed explanation thereof is omitted here. The third embodiment also provides advantageous effects similar to those of the first embodiment.

In each of the first through third embodiments, the DOPOS film 114 is formed as an example on the inner side surface of the contact hole 113 as a stopper film for preventing the inner side surface of the contact hole 113 from being etched during a process for cleaning the surface of the cobalt silicide layer 109. However, it is also possible to use, for example, an amorphous silicon film, an insulating film and the like, in place of the DOPOS film 114, as long as the material of the film is hard to be etched by cleaning fluid such as dilute hydrofluoric acid and the like which is used to clean the contact surface of the semiconductor element such as the surface of the refractory metal silicide layer or the surface of the silicon substrate. In addition to the wet etching process of the above-mentioned embodiment, the cleaning process for the contact surface of the semiconductor element according to the present invention also includes removing unnecessary substance such as native oxide, organic material, dust or the like on the contact surface of the semiconductor element and the like.

In case the DOPOS film is used as the stopper film as in the first through third embodiment, or in case the amorphous silicon film into which impurities are doped to lower resistance thereof is used as the stopper film, the stopper film itself has electrical conductivity and, therefore, it is possible to integrally form the contact plug 115 by using the stopper film and the polysilicon film material which is thereafter introduced into the contact hole 113. Therefore, it is possible to avoid reduction of a diameter or a cross sectional area of the contact plug 115 and, therefore, to decrease a resistance of the contact plug 115. In case the insulator film is used as the stopper film, the diameter of the contact plug becomes smaller than the inner diameter of the contact hole by the film thickness of the stopper film. Therefore, it becomes disadvantageous to use the insulating film, with respect to lowering of the contact plug resistance.

In each of the first through third embodiments, the silicon nitride film 110 is formed under the interlayer insulating film 111. However, in place of the silicon nitride film 110, it is possible to use an insulating film having an etching selectivity with respect to the silicon oxide film constituting the interlayer insulating film 111, that is, an insulating film made of material having an etching rate different from that of the silicon oxide.

Figure 7:
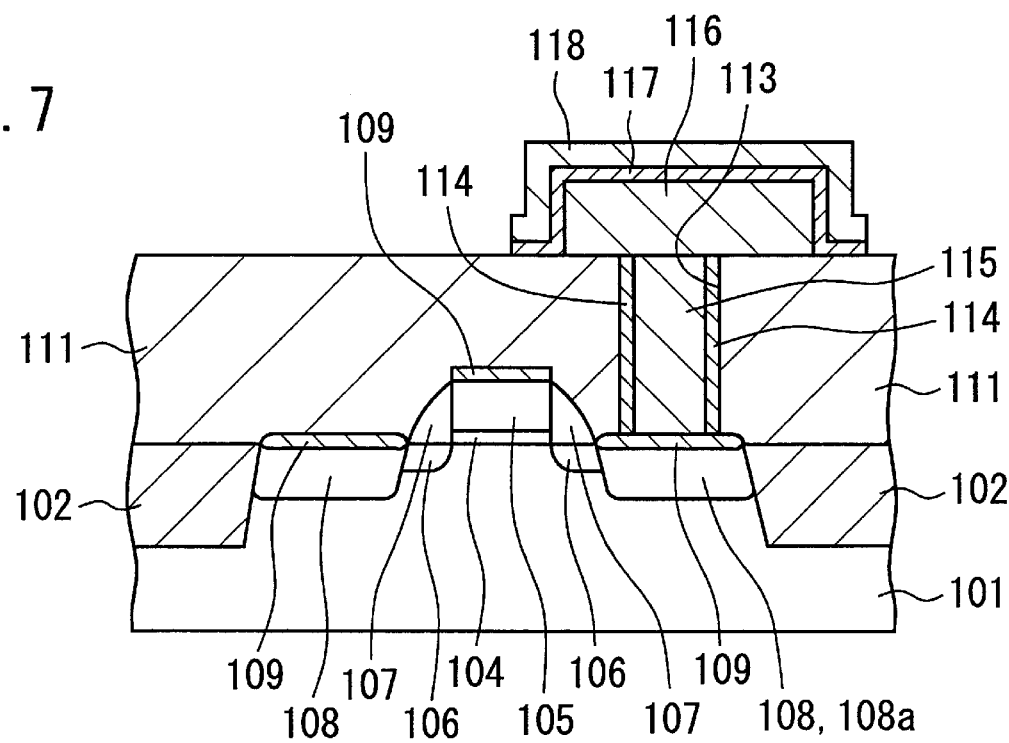
FIG. 7 is a cross sectional view showing a schematic cross sectional structure of workpiece obtained after forming a capacitor insulating film and a common capacitor electrode during a process of manufacturing a semiconductor device according to a fourth embodiment of the present invention.
Figure 8A:
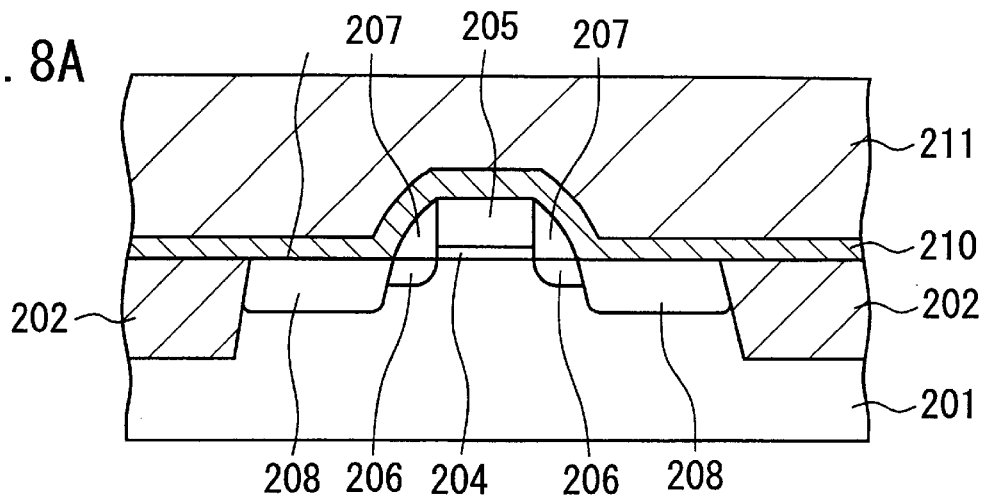
FIG. 8A through FIG. 8C are cross sectional views showing schematic cross sectional structures of workpieces obtained during a process of manufacturing a semiconductor device according to a first conventional method.
Figure 8B:
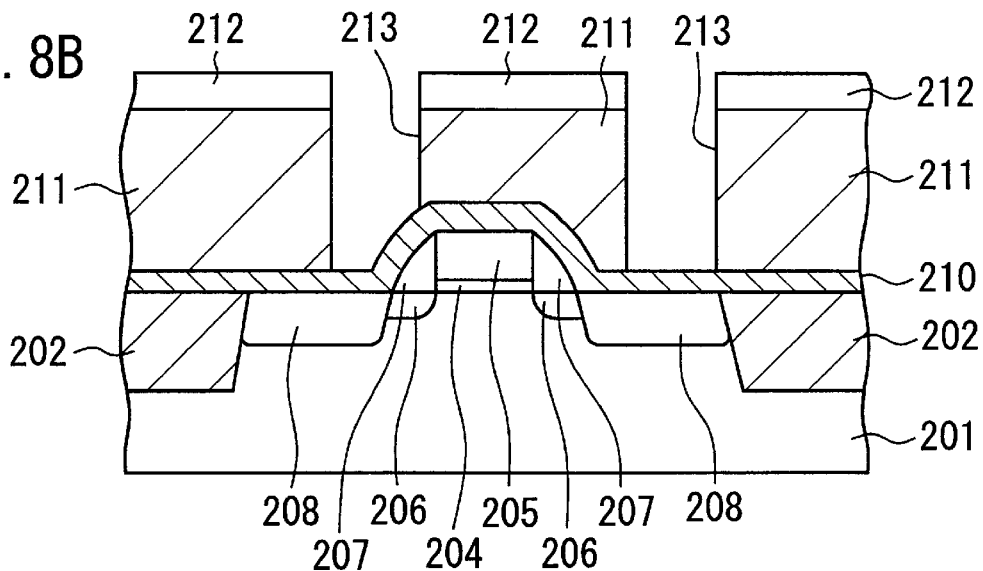
Figure 8C:
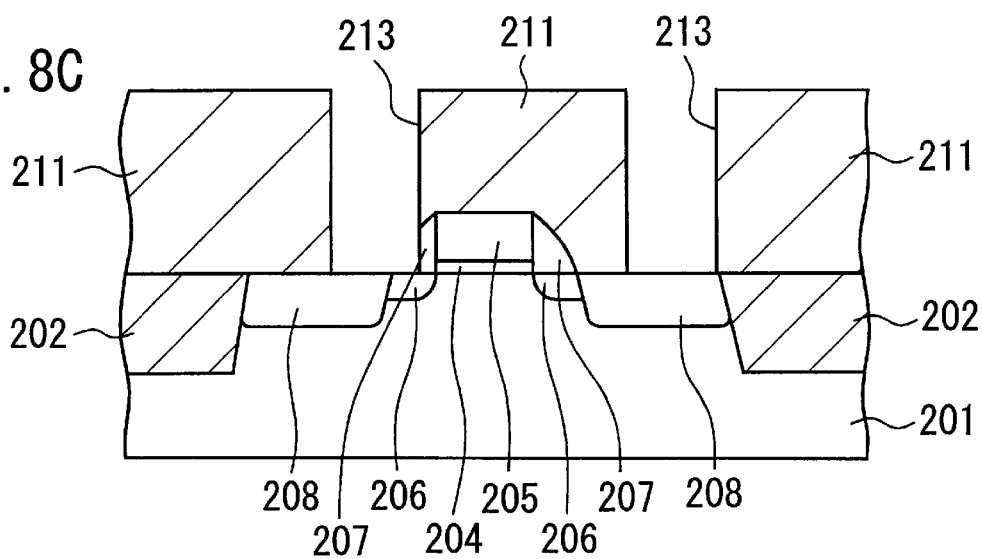
Figure 9A:
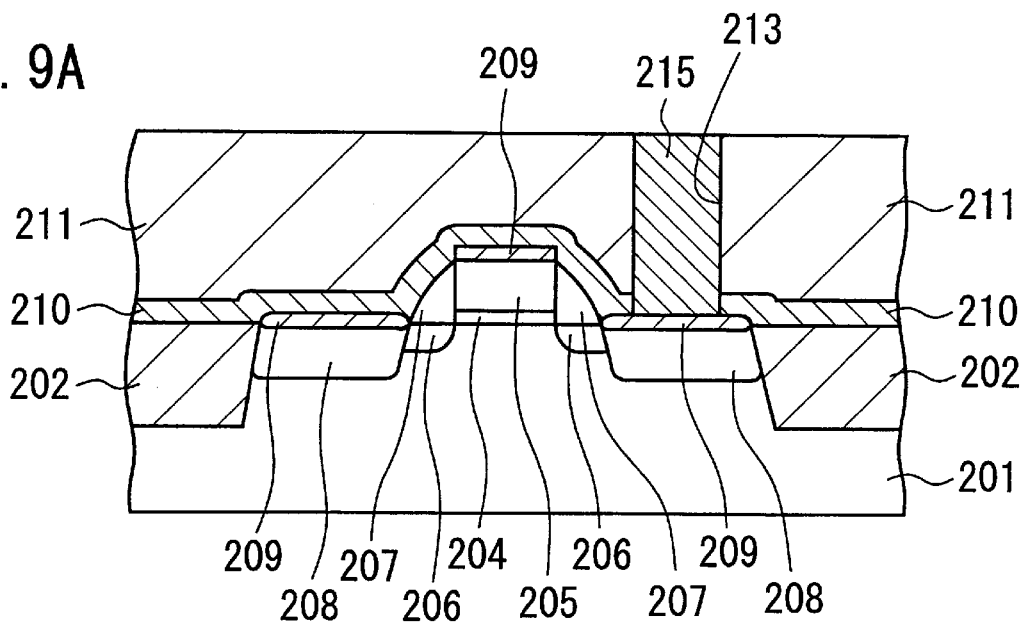
FIG. 9A and FIG. 9B are cross sectional views showing schematic cross sectional structures of workpieces obtained during a process of manufacturing a semiconductor device according to a second conventional method.
Figure 9B:
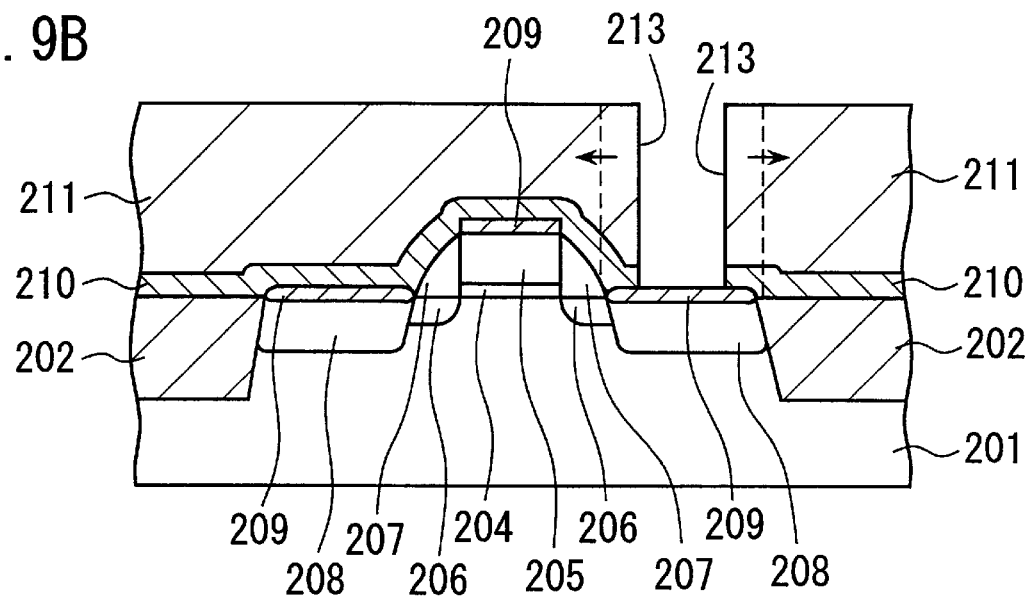

FIG. 7 shows a cross sectional structure of a workpiece after forming a capacitor insulating film 117 and a common electrode 118 according to a method of manufacturing a semiconductor device as a fourth embodiment of the present invention. The cross sectional structure shown in FIG. 7 corresponds to the cross sectional structure shown in FIG. 4 fabricated according to the first embodiment. As shown in FIG. 7, the method according to the fourth embodiment is substantially the same as that according to the first embodiment, except that, in the fourth embodiment, the silicon nitride film 110 is not formed. In case the contact hole 113 can be formed with such a precision that the location of the contact hole 113 does not overlap the location of the gate electrode 105, the sidewall spacer 107 and/or the STI 102 when the contact hole 113 is formed by over-etching the interlayer insulating film 111, it is possible to omit the silicon nitride film 110 or an insulating film of other material replacing the silicon nitride film 10 as shown in FIG. 7. In this embodiment, a process for removing the silicon nitride film 110 and the like is not required after forming the stopper film, i.e., the DOPOS film 114 only on the inner side surface of the contact hole 113, so that a manufacturing process of the semiconductor device can be simplified and shortened.

The present invention is also effective when the interlayer insulating film 111 has a stacked structure comprising a plurality of insulating films, for example, a plasma silicon oxide film and a BSG film. Even in such case, since the stopper film 114 exists on the inner side surface of the contact hole 113, it is possible to prevent the inner side surface of the contact hole 113 from being etched non-uniformly by a cleaning process of a contact surface of a circuit element or a semiconductor element, so that it is possible to prevent the inner side surface of the contact hole 113 from becoming uneven. Therefore, when the contact hole 113 is filled with conductive material to form a contact plug 115, void or voids are not produced in the contact plug 115 and it becomes possible to fabricate a reliable contact structure.

As mentioned above, according to the present invention, in a process of cleaning a contact surface of a circuit element exposed at an inner bottom portion of a contact hole after forming the contact hole, since a stopper film which is resistant against a cleaning fluid exists on an inner side surface of the contact hole, the inner side surface of the contact hole is not exposed to the cleaning fluid. Therefore, the inner side surface of the contact hole is not etched and an inner diameter or a cross sectional area of the contact hole is not enlarged. Thus, when the cleaning process is performed, adjacent contact holes do not overlap with each other. Also, when the contact hole is filled with conductive material to form a contact plug, the contact plug is not short-circuited with other contact plugs and the like. Consequently, according to the present invention, it is possible to manufacture a semiconductor device having a reliable contact structure, even when the semiconductor device comprises minute components and is highly integrated.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method of manufacturing a semiconductor device comprising:

preparing a semiconductor substrate;

forming a semiconductor element on said semiconductor substrate;

forming a first insulating film on said semiconductor substrate so as to cover said semiconductor element;

selectively removing said first insulating film to form an opening;

forming an electrically conductive stopper film directly on at least a portion of an inner side surface of said opening;

cleaning a contact surface of said semiconductor element exposed at a bottom portion of said opening, said stopper film being made of a material which is resistant against a cleaning fluid used in said cleaning process; and filling said opening with conductive material that directly contacts an inner side surface of said stopper film.

2. A method of manufacturing a semiconductor device as set forth in claim 1, wherein, in said cleaning a contact surface of said semiconductor element exposed at a bottom portion of said opening, wet etching is performed by using dilute hydrofluoric acid.

3. A method of manufacturing a semiconductor device as set forth in claim 2, wherein said stopper film is made of a material which resists etching by dilute hydrofluoric acid.

4. A method of manufacturing a semiconductor device as set forth in claim 1, wherein said stopper film is made of doped polysilicon.

5. A method of manufacturing a semiconductor device as set forth in claim 4, wherein said stopper film and said conductive material filled into said opening in said filling said opening with conductive material constitutes a contact plug.

6. A method of manufacturing a semiconductor device as set forth in claim 1, wherein said stopper film comprises at least one material selected from a group consisting of polysilicon and amorphous silicon.

7. A method of manufacturing a semiconductor device as set forth in claim 1, wherein, on said contact surface of said semiconductor element, there is formed a refractory metal silicide layer; and wherein in said cleaning a contact surface of said semiconductor element exposed at a bottom portion of said opening, at least a portion of said refractory metal silicide layer exposed at a bottom portion of said opening is removed by etching.

8. A method of manufacturing a semiconductor device as set forth in claim 1, wherein said first insulating film includes silicon oxide.

9. A method of manufacturing a semiconductor device as set forth in claim 1, wherein said first insulating film includes at least one material selected from a group consisting of BSG (boro-silicate glass) and BPSG (boro-phospho silicate glass).

10. A method of manufacturing a semiconductor device as set forth in claim 1, wherein said first insulating film has a stacked structure comprising a plurality of insulating films.

11. A method of manufacturing a semiconductor device as set forth in claim 1, wherein said semiconductor substrate is a silicon substrate.

12. A method of manufacturing a semiconductor device as set forth in claim 1, wherein said semiconductor element is a MOS transistor.

13. A method of manufacturing a semiconductor device as set forth in claim 1, wherein said opening is a contact hole.

14. A method of manufacturing a semiconductor device as set forth in claim 1, wherein, in said filling said opening with conductive material, said opening is filled with polysilicon.

15. A method of manufacturing a semiconductor device as set forth in claim 1, wherein said forming a stopper film on at least a portion of an inner side surface of said opening comprises:

forming a stopper film on a whole on a surface of said semiconductor substrate; and etching back said stopper film to remove said stopper film from portions other than said side surface of said opening and to leave said stopper film on said side surface of said opening.

16. A method of manufacturing a semiconductor device as set forth in claim 1, further comprising, after said forming a semiconductor element on said semiconductor substrate and before said forming a first insulating film on said semiconductor substrate so as to cover said semiconductor element, forming a second insulating film on said semiconductor substrate so as to cover said semiconductor element, said second insulating film functions as an etching stopper film in said selectively removing said first insulating film to form an opening;

wherein, in said forming a first insulating film on said semiconductor substrate so as to cover said semiconductor element, said first insulating film is formed on said second insulating film; and wherein, in said selectively removing said first insulating film to form an opening, said second insulating film is exposed at a bottom portion of said opening.

17. A method of manufacturing a semiconductor device as set forth in claim 16, further comprising, after said forming a stopper film on at least a portion of an inner side surface of said opening and before said cleaning a contact surface of said semiconductor element exposed at a bottom portion of said opening, removing a portion of said second insulating film which is exposed at a bottom portion of said opening formed in said first insulating film, thereby making said opening reach said contact surface of said semiconductor element.

18. A method of manufacturing a semiconductor device as set forth in claim 16, wherein said second insulating film is a silicon nitride film.

19. A method of manufacturing a semiconductor device comprising:

preparing a silicon substrate;

forming at least a gate electrode and source/drain regions on said silicon substrate to form a MOS transistor;

forming a refractory metal silicide layer on at least said source/drain regions;

forming a silicon nitride film on said silicon substrate so as to cover said MOS transistor;

forming an insulating film including at least silicon oxide on said silicon nitride film;

selectively removing said insulating film to form an opening;

forming an electrically conductive stopper film on a whole surface of said silicon substrate, said stopper film comprising a first electrically conductive material which resists etching by dilute hydrofluoric acid;

anisotropically etching said stopper film to remove said stopper film from portions other than said side surface of said opening and to leave said stopper film on said side surface of said opening;

removing a portion of said silicon nitride film which is exposed at a bottom portion of said opening, thereby making said opening reach said refractory metal silicide layer;

cleaning a surface portion of said refractory metal silicide layer which is exposed at a bottom portion of said opening by wet etching which uses dilute hydrofluoric acid; and filling said opening with a second conductive material, said second conductive material filling said opening together with said first conductive material constituting said stopper film to form a contact plug, said second conductive material directly contacting an inner side surface of said first conductive material.

20. A method of manufacturing a semiconductor device as set forth in claim 19, further comprising, after said preparing a silicon substrate and before said forming at least a gate electrode and source/drain regions on said silicon substrate to form a MOS transistor, forming an element isolation insulating film for defining an element forming region on said silicon substrate, and wherein, in said forming at least a gate electrode and source/drain regions on said silicon substrate to form a MOS transistor, said MOS transistor is formed in said element forming region defined by said element isolation insulating film, and sidewall spacers are formed on sidewalls of said gate electrode.

* * * * *